US012562353B2

(12) United States Patent
Franklin et al.

(10) Patent No.: US 12,562,353 B2
(45) Date of Patent: Feb. 24, 2026

(54) REPLACEABLE ELECTROSTATIC CHUCK OUTER RING FOR EDGE ARCING MITIGATION

(71) Applicant: Applied Materials, Inc., Santa Clara, CA (US)

(72) Inventors: Timothy Joseph Franklin, Campbell, CA (US); Jaeyong Cho, San Jose, CA (US); Alexander Sulyman, Santa Clara, CA (US); Xue Chang, San Jose, CA (US); Kartik Ramaswamy, San Jose, CA (US); Steven E. Babayan, Los Altos, CA (US); Anwar Husain, Pleasanton, CA (US); David Coumou, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 349 days.

(21) Appl. No.: 17/823,702

(22) Filed: Aug. 31, 2022

(65) Prior Publication Data

US 2023/0118651 A1 Apr. 20, 2023

Related U.S. Application Data

(60) Provisional application No. 63/240,433, filed on Sep. 3, 2021, provisional application No. 63/240,250, filed on Sep. 2, 2021.

(51) Int. Cl.
*H01J 37/32* (2006.01)
*H01L 21/683* (2006.01)

(52) U.S. Cl.
CPC .... *H01J 37/32724* (2013.01); *H01L 21/6833* (2013.01); *H01J 2237/002* (2013.01); *H01J 2237/026* (2013.01); *H01J 2237/2007* (2013.01)

(58) Field of Classification Search
CPC .......... H01J 37/32724; H01J 2237/002; H01J 2237/026; H01J 2237/2007; H01L 21/6833
See application file for complete search history.

(56) References Cited

U.S. PATENT DOCUMENTS

| | | | | | |
|---|---|---|---|---|---|
| 5,796,074 A | * | 8/1998 | Edelstein | .................. | F27B 5/14 |
| | | | | | 219/390 |
| 5,805,408 A | * | 9/1998 | Maraschin | .......... | H01L 21/6831 |
| | | | | | 361/234 |

(Continued)

FOREIGN PATENT DOCUMENTS

| | | |
|---|---|---|
| CN | 102468208 A | 5/2012 |
| CN | 103794540 A | 5/2014 |

(Continued)

OTHER PUBLICATIONS

International Search Report issued to PCT/US2022/042237 on Dec. 9, 2022.

(Continued)

*Primary Examiner* — Danny Nguyen
*Assistant Examiner* — Samantha L Faubert
(74) *Attorney, Agent, or Firm* — Patterson + Sheridan, LLP

(57) ABSTRACT

Embodiments of the present disclosure herein include an apparatus for processing a substrate. More specifically, embodiments of this disclosure provide a substrate support assembly that includes an electrostatic chuck (ESC) assembly. The ESC assembly comprises a cooling base having a top surface and an outer diameter sidewall, an ESC having a substrate support surface, a bottom surface and an outer diameter sidewall, the bottom surface of the ESC coupled to the top surface of the cooling base by an adhesive layer. The substrate support assembly includes a blocking ring disposed around the outer diameter sidewalls of the cooling (Continued)

base and ESC, the blocking ring shielding an interface between the bottom surface of the ESC and the top surface of the cooling base.

18 Claims, 6 Drawing Sheets

(56) References Cited

U.S. PATENT DOCUMENTS

| | | | | |
|---|---|---|---|---|
| 5,946,184 | A * | 8/1999 | Kanno | H01L 21/6833 |
| | | | | 361/234 |
| 6,730,175 | B2 * | 5/2004 | Yudovsky | C23C 16/4586 |
| | | | | 156/345.52 |
| 8,633,423 | B2 * | 1/2014 | Lin | H01L 21/67109 |
| | | | | 219/465.1 |
| 10,943,808 | B2 | 3/2021 | Noorbakhsh et al. | |
| 11,127,619 | B2 * | 9/2021 | Ramaswamy | H01L 21/6833 |
| 11,373,893 | B2 | 6/2022 | Sarode Vishwanath et al. | |
| 11,646,183 | B2 * | 5/2023 | Prouty | H01J 37/32715 |
| | | | | 156/345.34 |
| 11,764,041 | B2 * | 9/2023 | Garcia De Gorordo | |
| | | | | H01L 21/6831 |
| 2002/0036881 | A1 | 3/2002 | Shamouilian et al. | |
| 2004/0065259 | A1 * | 4/2004 | Inazumachi | H01L 21/67109 |
| | | | | 118/724 |
| 2012/0091108 | A1 | 4/2012 | Lin et al. | |
| 2013/0097840 | A1 | 4/2013 | Schaefer et al. | |
| 2014/0265089 | A1 | 9/2014 | Tantiwong et al. | |
| 2017/0167790 | A1 * | 6/2017 | Gaff | H01L 21/6831 |
| 2017/0352566 | A1 | 12/2017 | Ramaswamy et al. | |
| 2018/0151402 | A1 | 5/2018 | Noorbakhsh | |
| 2020/0035535 | A1 * | 1/2020 | Parkhe | H01L 21/67103 |
| 2020/0185248 | A1 | 6/2020 | Sarode Vishwanath et al. | |
| 2020/0194231 | A1 * | 6/2020 | Chen | H01J 37/32091 |
| 2020/0395197 | A1 | 12/2020 | Garcia De Gorordo et al. | |
| 2021/0082730 | A1 * | 3/2021 | Sarode Vishwanath | |
| | | | | H01L 21/6833 |
| 2021/0343512 | A1 | 11/2021 | Parkhe et al. | |
| 2022/0262664 | A1 * | 8/2022 | Sarode Vishwanath | |
| | | | | H01L 21/6833 |

FOREIGN PATENT DOCUMENTS

| | | |
|---|---|---|
| JP | H10150100 A | 6/1998 |
| JP | 2018050039 A | 3/2018 |
| JP | 2018518833 A | 7/2018 |
| JP | 2019505088 A | 2/2019 |
| KR | 1020190138285 A | 12/2019 |
| TW | 201027661 A | 7/2010 |
| TW | 202130980 A | 8/2021 |

OTHER PUBLICATIONS

Taiwan Office Action issued to patent application No. 111133150 on Aug. 21, 2024.
Korean Office Action issued to patent application No. 10-2024-7010068 on Jan. 23, 2025.
Taiwan Office Action issued to Patent Application No. 111133150 issued on Apr. 18, 2025.
Japanese Office Action issued to patent application No. 2024-513930 on Mar. 11, 2025.
Japan Office Action issued to patent application No. 2024-513930 on Jul. 11, 2025.

* cited by examiner

REPLACEABLE ELECTROSTATIC CHUCK OUTER RING FOR EDGE ARCING MITIGATION

CROSS-REFERENCE TO RELATED APPLICATIONS

This application claims priority to and benefit of U.S. Provisional Patent Application Ser. No. 62/240,250, filed Sep. 2, 2021, entitled, "Replaceable Electrostatic Chuck Outer Ring for Edge Arcing Mitigation," which is incorporated herein by reference in its entirety; this application also claims priority to and benefit of U.S. Provisional Patent Application Ser. No. 63/240,433, filed Sep. 3, 2021, entitled, "Bonded Electrostatic Chuck Outer Protective Ring for Edge Arching Mitigation," which is also incorporated herein by reference in its entirety.

BACKGROUND

Field

Embodiments of the present disclosure generally relate to apparatus and methods for fabricating semiconductor devices. More specifically, apparatus disclosed herein relate to an electrostatic chuck assembly for use in a plasma processing chamber.

Description of the Related Art

Semiconductor substrates are processed for a wide variety of applications, including the fabrication of integrated devices and micro devices. One such processing device is a plasma processing chamber. During processing, the substrate is positioned on an electrostatic chuck assembly within the plasma processing chamber. The electrostatic chuck assembly may have an electrostatic chuck, a cooling base, a facility plate and/or a base. The electrostatic chuck (ESC) may have chucking electrodes for biasing the substrate to the electrostatic chuck.

A plasma is formed in the plasma processing chamber for processing the substrate. During plasma processing, tight controls over substrate temperature along with the shape of the plasma over the substrate are used to obtain good and consistent results. Temperature uniformity is provided by a plurality of heaters in the ESC along with a cooling base. The shape of the plasma is influenced by electrodes in the ESC as well as the shape of the ESC facing the plasma, i.e., process rings. Process skew may occur due to the plasma coupling to the ESC and/or non-uniformity of the temperature across the ESC negatively impacting process performance.

Additionally, during processing, the plasma may form a circuit between the electrostatic chuck assembly and a wall of the chamber and cause an arc. Arcing from the electrostatic chuck assembly to ground or from an edge ring to ESC cooling base can cause damage to the substrate or alter the plasma in a way that may cause a processing defect, i.e., negatively impacting process performance. Edge arcing is one of the main locations for arcing on high power ESCs and is mitigated using coatings on the ESC periphery. However these coatings have many issues including that they are easily damaged, eroded. The coatings are porous, prone to cracking, difficult to refurbish, and expensive.

Therefore, there is a need for an improved chamber design to improve process performance.

SUMMARY

The present disclosure generally includes a substrate support assembly comprising an electrostatic chuck (ESC) assembly. The ESC assembly comprises a cooling base having a top surface and an outer diameter sidewall, an ESC having a substrate support surface, a bottom surface and an outer diameter sidewall, the bottom surface of the ESC coupled to the top surface of the cooling base by an adhesive layer. The substrate support assembly includes a blocking ring disposed around the outer diameter sidewalls of the cooling base and ESC, the blocking ring shielding an interface between the bottom surface of the ESC and the top surface of the cooling base.

Embodiments of the present disclosure may further provide a substrate support assembly comprising an electrostatic chuck (ESC) assembly. The ESC assembly comprises an ESC having a substrate support surface and a bottom surface, and a cooling base disposed under the bottom surface of the ESC. A portion of the bottom surface of the ESC horizontally extends beyond a top surface of the cooling base, a facility plate disposed under the cooling base, wherein the bottom surface of the cooling base horizontally extends beyond the facility plate, an insulator plate disposed under the facility plate, wherein a portion of a top surface of the insulator plate horizontally extends beyond the bottom surface of the cooling base, and a blocking ring disposed between of the bottom surface of the ESC that horizontally extends beyond a top surface of the cooling base and the top surface of the insulator plate that horizontally extends beyond the bottom surface of the cooling base, the blocking ring surrounding the cooling base.

Embodiments of the present disclosure may further provide a substrate support assembly comprising an electrostatic chuck (ESC). The ESC assembly comprises an ESC having a substrate support surface and a bottom surface, a cooling base disposed under the bottom surface of the ESC. A portion of the bottom surface of the ESC horizontally extends beyond a top surface of the cooling base, a facility plate disposed under the cooling base, an insulator plate disposed under the facility plate, the bottom surface of the cooling base horizontally extending beyond the facility plate and the insulator plate, a grounding plate disposed under the insulator plate, a portion of the grounding plate horizontally extending beyond the insulator plate, and a blocking ring disposed between of the bottom surface of the ESC that horizontally extends beyond a top surface of the cooling base and the portion of the grounding plate that horizontally extends beyond the insulator plate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a substrate support assembly that includes a blocking ring that protects a bond between an electrostatic chuck (ESC) and a cooling base. The blocking ring also function as a vacuum to atmosphere seal between the blocking ring and both the ESC and cooling base, which allows for the RF hot cooling base to remain at atmospheric pressure, which beneficially mitigates arcing.

The substrate support assembly described below may be utilized in an etch processing chamber and in other types of plasma and non-plasma enhanced processing chambers such as, physical vapor deposition chambers, chemical vapor deposition chambers, ion implantation chambers, among others, and other systems where protection of the bond layer disposed between the cooling base and ESC is desirable.

Figure 1:
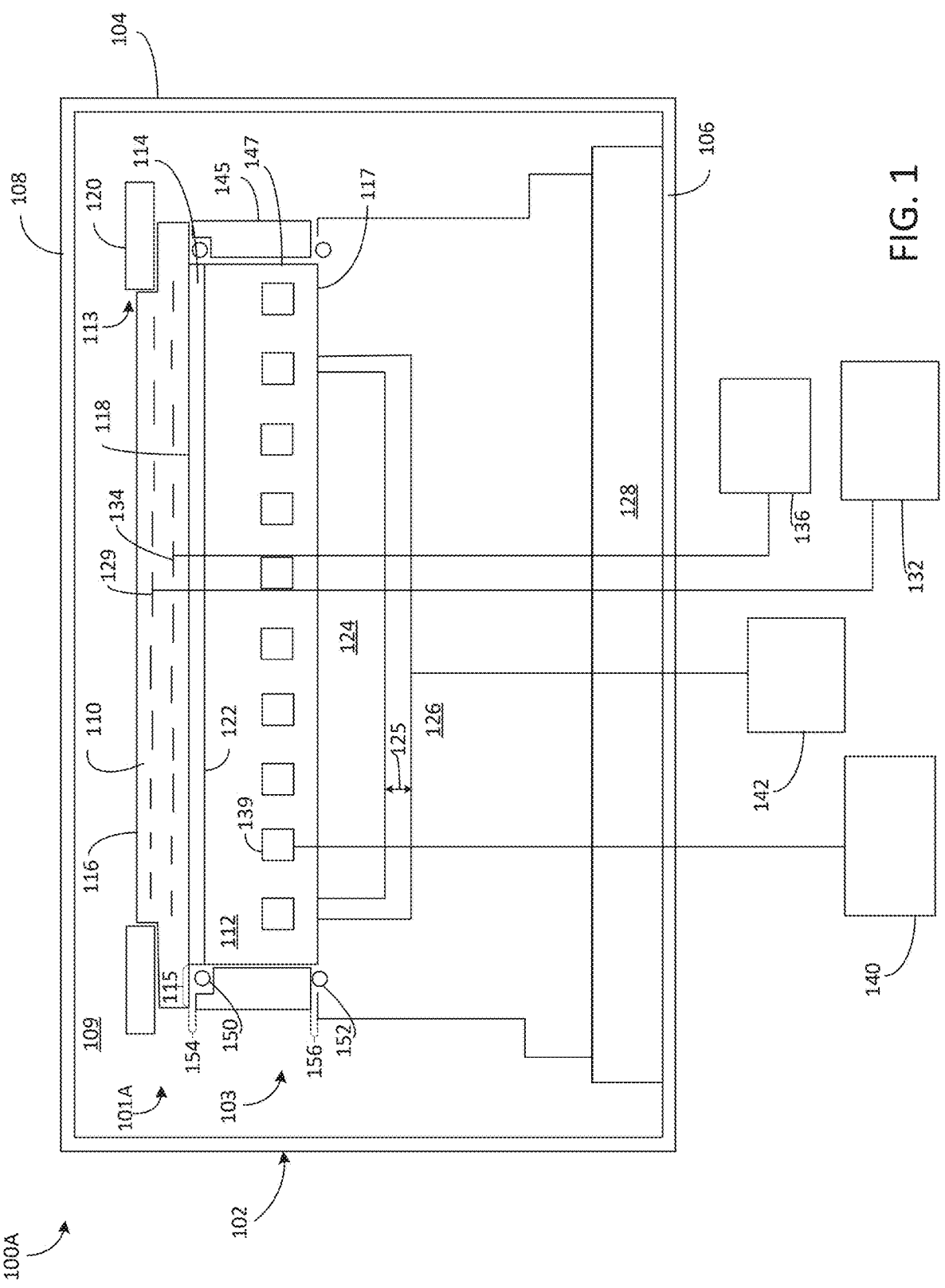
FIG. 1 is a cross-sectional schematic view of an exemplary plasma chamber including substrate support assembly according to an embodiment.

FIG. 1 is a cross-sectional schematic view of an exemplary plasma chamber 100A including substrate support assembly 101A according to an embodiment. The substrate support assembly 101A may be utilized in multiple types of plasma processing chambers, for example plasma treatment chambers, annealing chambers, physical vapor deposition chambers, chemical vapor deposition chambers, and ion implantation chambers, among others, as well as other systems where protection of adhesive layers within the substrate support assembly 101A from environmental conditions within the plasma processing chamber 100A is desirable. It is also contemplated that the disclosure may be used to advantage in processing chambers that utilize plasmas.

The plasma processing chamber 100A includes a chamber body 102 having sidewalls 104, a bottom 106 and a lid 108 that enclose a processing region 109. The substrate support assembly 101 is disposed in the processing region 109.

The substrate support assembly 101 includes an electrostatic chuck assembly 103 (ESC assembly), a facility plate 124, an insulator plate 126, a ground plate 128, and a blocking ring 145.

The ESC assembly 103 includes an electrostatic chuck (ESC) 110 and a cooling base 112. In certain embodiments, the ESC assembly 103 may be surrounded by a quartz processing kit (not shown). The ESC 110 is coupled to the cooling base 112 using an adhesive layer 114. The ESC 110 includes a substrate support surface 116, a bottom surface 118, and a drop-off formed on the support surface 116, forming a ledge 113 that supports an edge ring 120. The edge ring 120 horizontally extends beyond an outer perimeter of the ESC 110. In one embodiment, the ESC 110 is fabricated from a dielectric body having an embedded chucking electrode 129. The dielectric body may be a ceramic material, such as alumina ($Al_2O_3$), aluminum nitride (AlN) or other suitable material. Alternately, the dielectric body of the ESC 110 may be fabricated from a polymer, such as polyimide, polyetheretherketone, polyaryletherketone and the like.

A top surface 122 of the cooling base 112 is coupled to the bottom surface 118 of the ESC 110 using the adhesive layer 114. The adhesive layer 114 may comprise epoxy containing materials, silicone containing materials, acrylic containing materials or other material suitable for bonding the ESC 110 to the cooling base 112. A portion 115 of the ESC 110 horizontally extends beyond the top surface 122 of the cooling base 112. Stated differently, the ESC 110 is wider than the cooling base 112.

The facility plate 124 is disposed under the cooling base 112. The facility plate 124 supported by a ground plate 128 is configured to facilitate electrical, cooling, heating, and gas connections with the substrate support assembly 101A. The ground plate 128 is supported by the bottom 106 of the processing chamber. An insulator plate 126 insulates the facility plate 124 from the ground plate 128. Stated differently, the insulator plate 126 is disposed above ground plate 128 and surrounds the facility plate 124. There may be an optional gap 125 defined between the facility plate 124 and the insulator plate 126. The distance of gap 125 may be between 0.002 inches and 0.010 inches. The gap 125 helps slow the transfer of heat between the facility plate 124 and the insulator plate 126. A top surface 117 of the insulator plate 126 horizontally extends beyond the cooling base 112. Stated differently, the insulator plate 126 is wider than the cooling base 112.

The chucking electrode 129 of the ESC 110 may be configured as a mono polar or bipolar electrode, or have another suitable arrangement. The chucking electrode 129 is coupled through an RF filter (not shown) to a chucking power source 132, which provides a DC power to electrostatically secure a substrate to the support surface 116 of the ESC 110.

The ESC 110 optionally includes one or more resistive heaters 134 embedded therein. The resistive heaters 134 are utilized to elevate the temperature of the ESC 110 to the processing temperature suitable for processing a substrate disposed on the support surface 116. The resistive heaters 134 are coupled through the facility plate 124 to an optional heater power source 136. The heater power source 136 may provide 500 watts or more power to the resistive heaters 134. The heater power source 136 includes a controller (not shown) utilized to control the operation of the heater power source 136, which is generally set to heat the substrate to a predetermined temperature. In one embodiment, the resistive heaters 134 include a plurality of laterally separated heating zones, wherein the controller enables at least one zone of the resistive heaters 134 to be preferentially heated relative to the resistive heaters 134 located in one or more of the other zones. For example, the resistive heaters 134 may be arranged concentrically in a plurality of separated heating zones. The resistive heaters 134 maintain a substrate at a processing temperature suitable for processing. In one embodiment, the processing temperature is not greater than about −50 degrees Celsius. For example, the processing temperature is between about −50 degrees Celsius to about −150 degrees Celsius. In yet other examples, the processing temperature is greater than about −50 degrees Celsius. For example, the processing temperature is between −50 degrees Celsius to about +150 degrees Celsius.

The cooling base 112 includes at least one cooling zone 139 that are each coupled to a coolant supply 140. The at least one cooling zone 139 may be arranged concentrically or in other suitable manner. For example, an inner zone may be provided under the substrate support surface 116 while an outer zone may be provided along the outer perimeter and possibly extending under the edge ring 120.

The facility plate 124 may include an optional cooling channel (not shown) that may be coupled to an optional coolant supply 142. When present, the coolant supply 142 provides a coolant that, in one example, can maintain an ambient temperature between about 25 degrees Celsius to about 35 degrees Celsius. The coolant provided by the coolant supply 142 is a heat transfer fluid, and in some examples, is a refrigerant. The coolant supply 142 provides the cooling material which is circulated through a coolant channel (not shown) of the facility plate 124. The coolant flowing through the coolant channel enables the facility plate 124 to be maintained at the predetermined ambient temperature, which assists in maintaining the insulator plate 126 at the predetermined ambient temperature.

In one embodiment, blocking ring 145 may be disposed between the ESC 110 and top surface 117 of the insulator plate 126 that extend past the cooling base 112 on both sides of the substrate support assembly 101A. Stated otherwise, the blocking ring 145 is disposed around an outer diameter sidewall 147 of the cooling base 112. In one example, blocking ring 145 is made from ceramic or other dielectric material. In one embodiment, the blocking ring 145 forms a vacuum seal to the ESC 110 via using a first seal 150. The blocking ring 145 forms a vacuum seal to the insulator plate 126 using a second seal 152. There is a top gap 154 between the ESC 110 and the blocking ring 145, and a bottom gap 156 between the ESC 110 and the insulator plate 126. Therefore, the blocking ring 145 does not contact the ESC 110 or the insulator plate 126. Stated otherwise, the outer perimeter of the cooling base 112 is fully isolated by a vacuum seal. Alternatively, the blocking ring 145 may be sealed to the ESC 110 and the facility plate 124 using bonding material in lieu of seals. The bonding material may be silicone based, an epoxy, or the like. Thus, the blocking ring 145 allows higher pressure, for example ambient pressure, to be utilized within portions of the substrate support assembly 101 disposed inward of the blocking ring 145 which also mitigates potential arcing within the substrate support assembly 101.

In some embodiments, components of the substrate support assembly 101A may be coupled to each other using fasteners (not shown). For example, the ground plate 128 may be coupled to the insulator plate 126 using a fastener, the insulator plate may be coupled to the facility plate 124 using a fastener, and the insulator plate may be coupled to the cooling base 112 using a fastener.

Advantageously, the blocking ring 145 forms a vacuum seal to the ESC 110 such that the outer diameter of the cooling base 112 is isolated. Stated differently, the outer diameter of the cooling base 112 and the outer diameter of the ESC 110 are on opposite sides of the vacuum seal while the blocking ring 145 functions as a plasma blocker to prevent erosion of the adhesive layer 114 between the ESC 110 and cooling base 112, and allows for the RF hot cooling base 112 to remain entirely at atmospheric pressure, which advantageously mitigates potential arcing.

Figure 2:
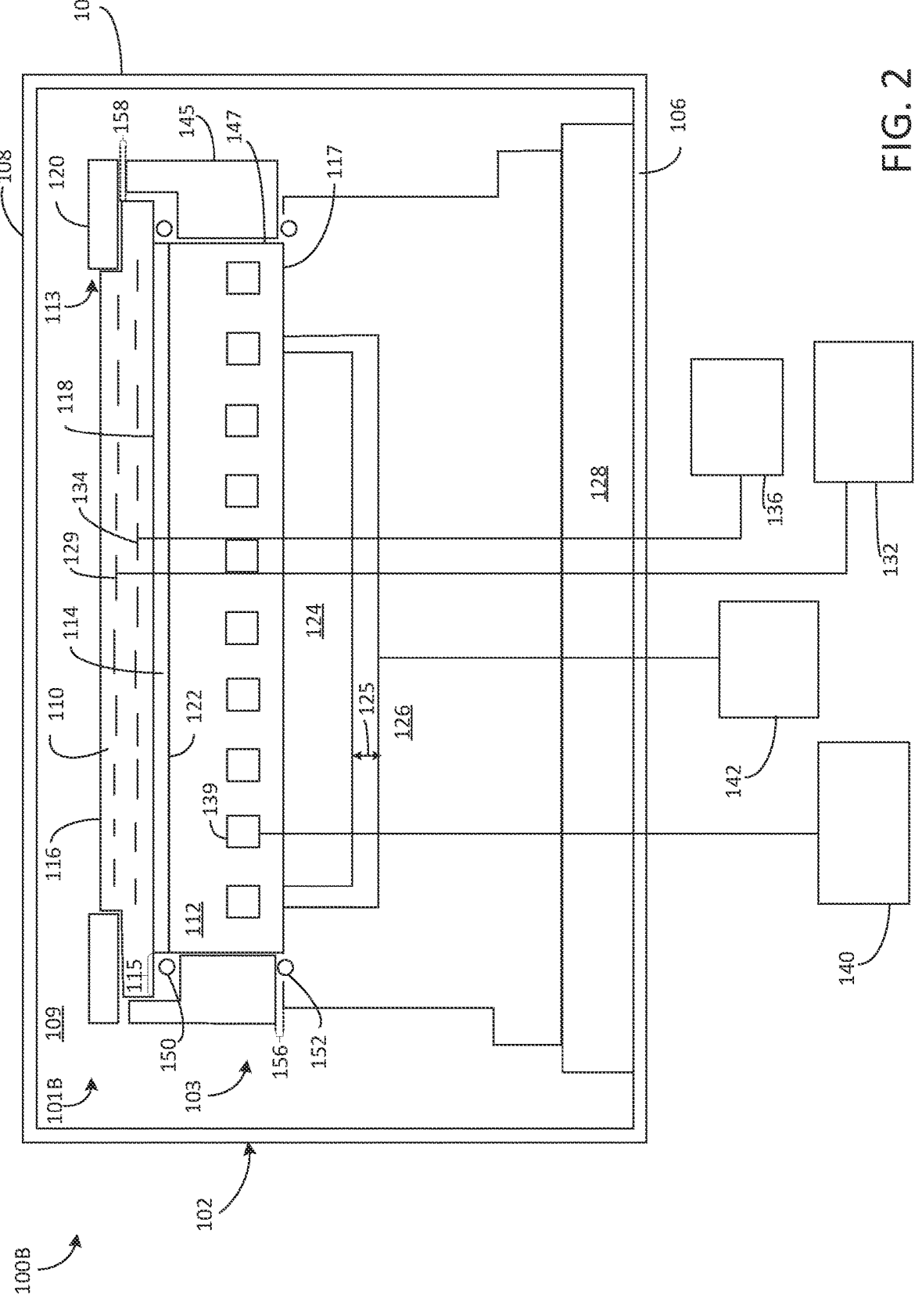
FIG. 2 is a cross-sectional schematic view of an exemplary plasma chamber including substrate support assembly according to an embodiment.

FIG. 2 is a cross-sectional schematic view of an exemplary plasma chamber 100B including a substrate support assembly 101B according to an embodiment. The substrate support assembly 101B is similar to substrate support assembly 101A with the addition that the blocking ring 145 is disposed around a portion of the outer perimeter of the ESC 110 with a gap 158 formed between the top of ledge 113 and the edge ring 120.

Figure 3:
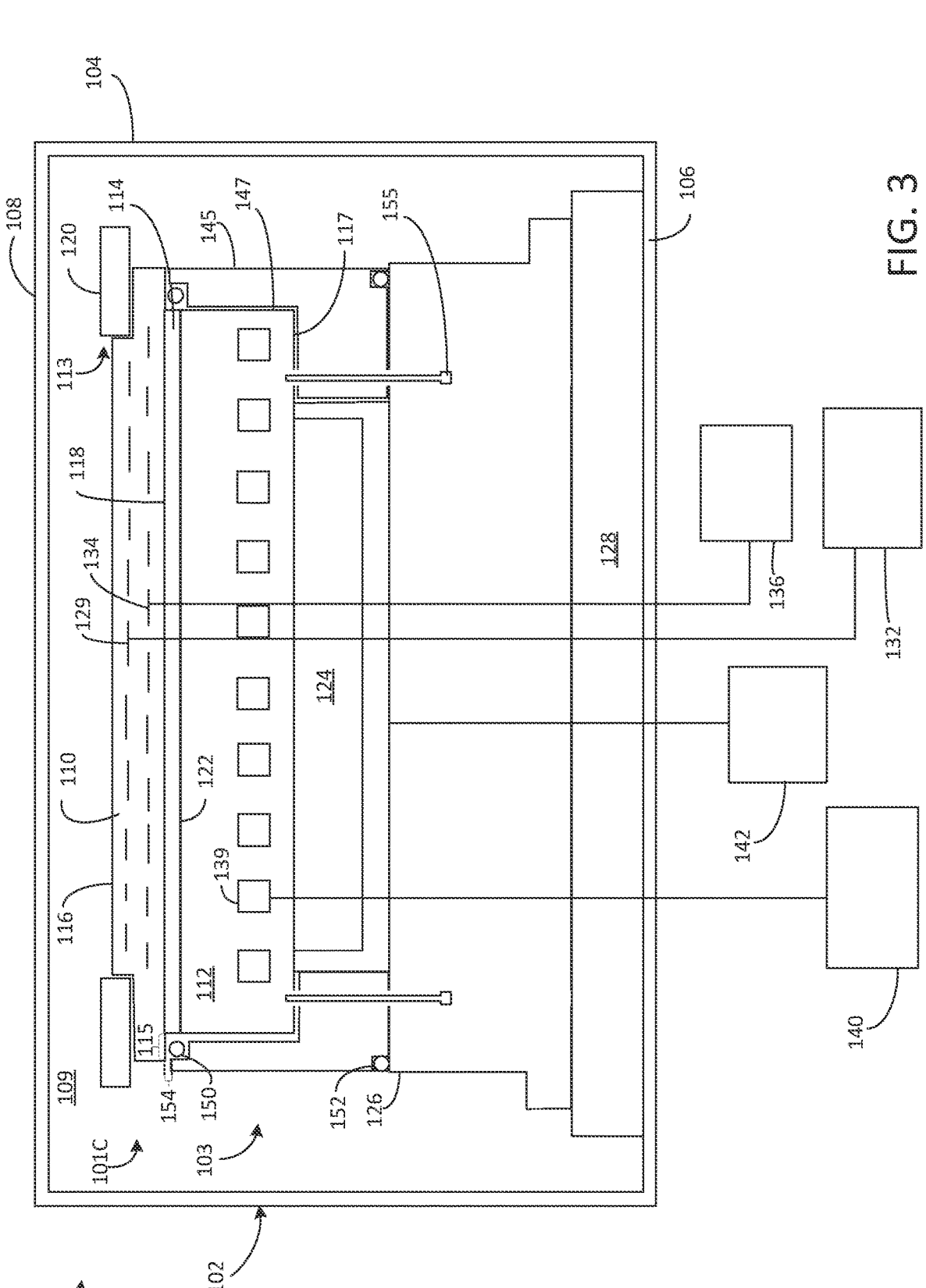
FIG. 3 is a cross-sectional schematic view of an exemplary plasma chamber including substrate support assembly according to an embodiment.

FIG. 3 is a cross-sectional schematic view of an exemplary plasma chamber 100C including a substrate support assembly 101C according to an embodiment. The substrate support assembly 101C is similar to substrate support assembly 101A except that the insulator plate 126 does not surround the facility plate 124. As illustrated in FIG. 3, the blocking ring 145 shields the gaps between the facility plate 124 and the cooling base 112, ensuring the facility plate 124 has no direct line of sight to the sidewalls of the plasma chamber 100C so that the potential for arcing therebetween is reduced. Advantageously, this eliminates the bottom gap 156 (FIG. 1) and allows for better control of the distance of the top gap 154 because the cooling base 112 sits on the shoulder of the blocking ring 145. Also, the seal force on the ESC 110 is decreased because only the force of the first seal 150 is transferred to the ESC 110. Furthermore, erosion of the insulator plate 126 and the second seal 152 is reduced because they are father away from the substrate support surface 116 (i.e., the processing area). In some embodiments, the blocking ring 145 may be coupled to the cooling base 112 and the insulator plate 126 via a fastener 155.

Figure 4:
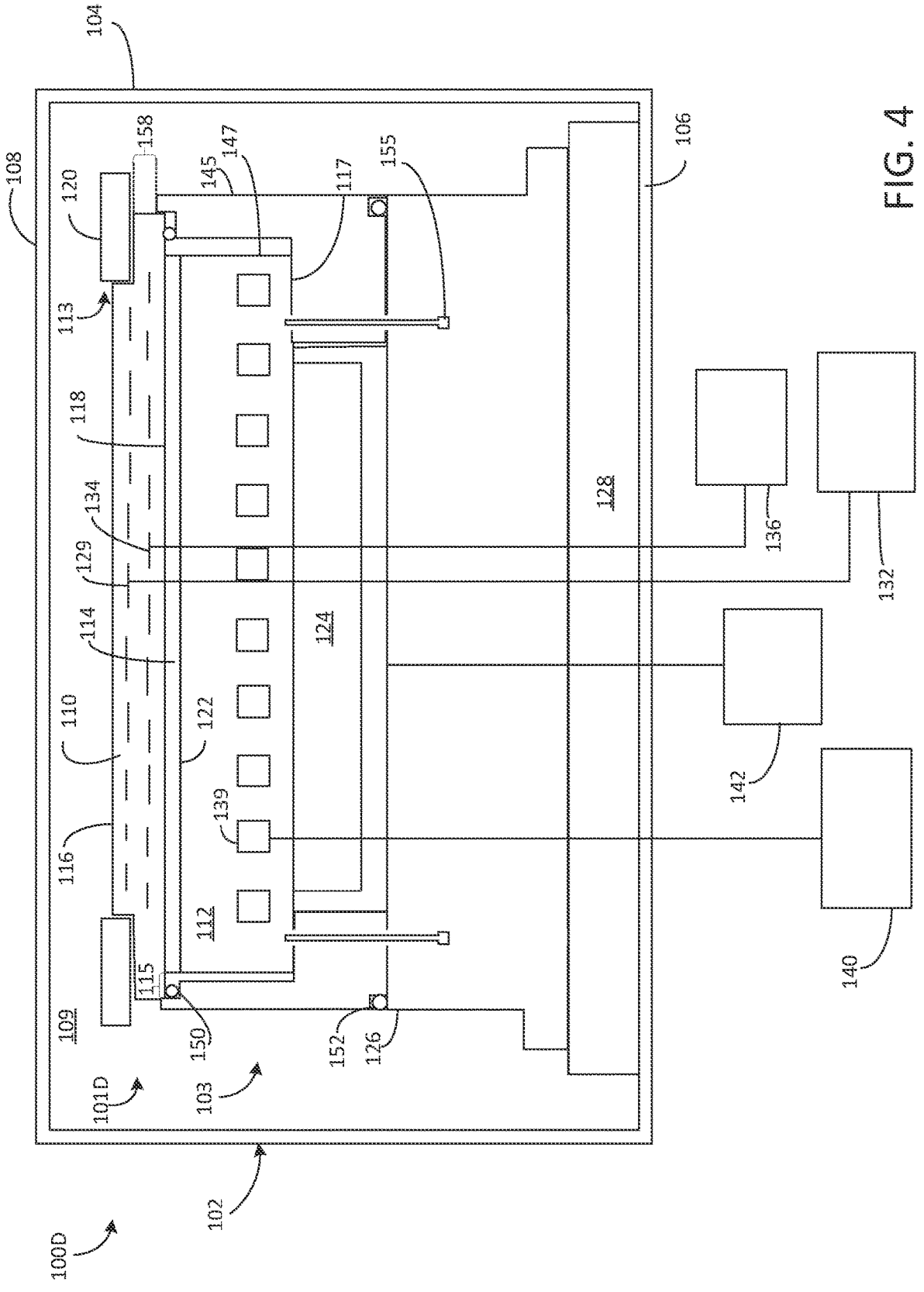
FIG. 4 is a cross-sectional schematic view of an exemplary plasma chamber including substrate support assembly according to an embodiment.

FIG. 4 is a cross-sectional schematic view of an exemplary plasma chamber 100D including substrate support assembly 101D according to an embodiment. Substrate support assembly 101D is similar to substrate support assembly 101C with the addition that the blocking ring 145 is disposed around a portion of the outer perimeter of the ESC 110 with gap 158 formed between the top of ledge 113 and the edge ring 120.

Figure 5:
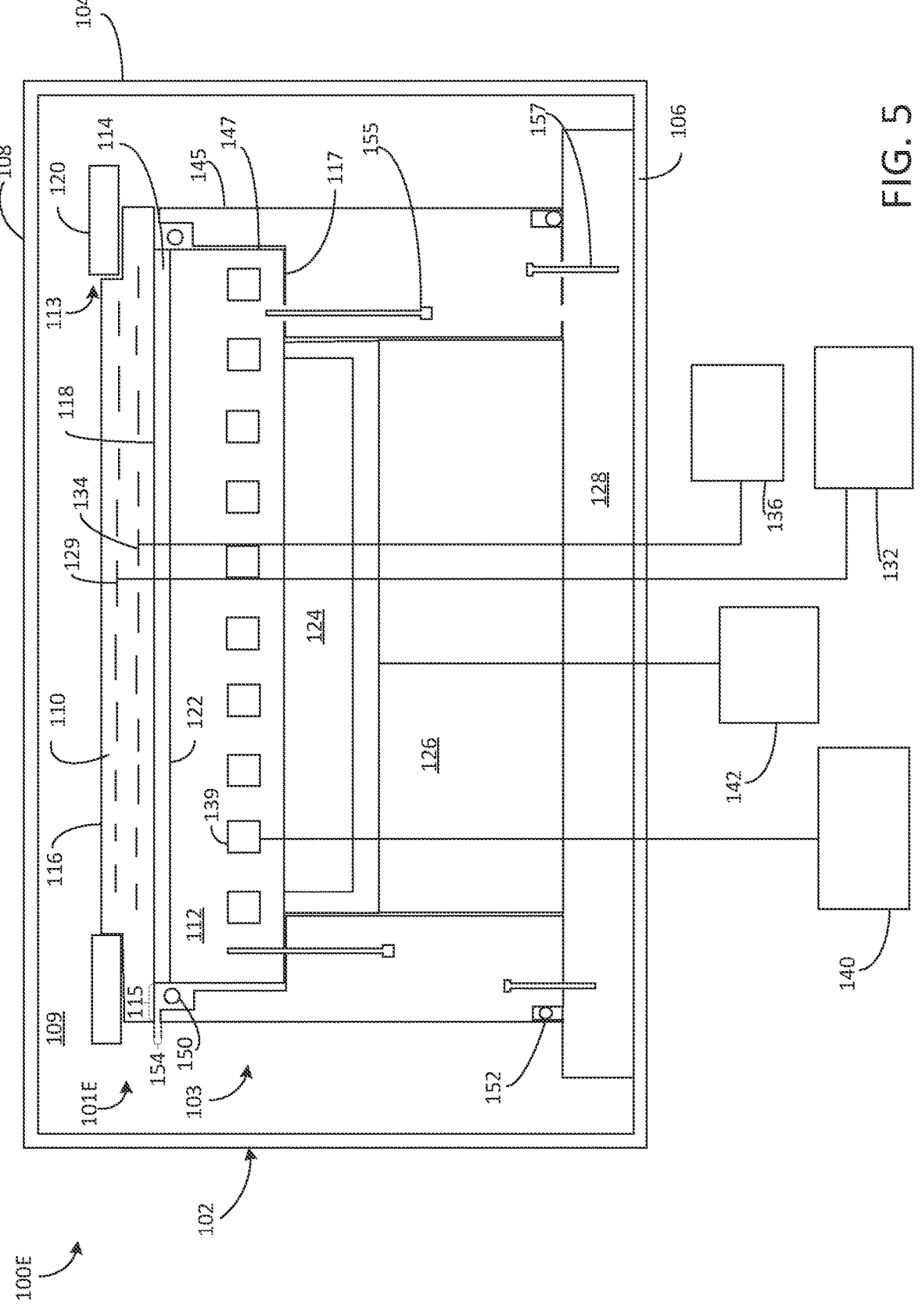
FIG. 5 is a cross-sectional schematic view of an exemplary plasma chamber including substrate support assembly according to an embodiment.

FIG. 5 is a cross-sectional schematic view of an exemplary plasma chamber 100E including substrate support assembly 101E according to an embodiment. Substrate support assembly 101E is similar to substrate support assemblies 101A-101D except that the insulator plate 126 is flush with the facility plate 124. As illustrated in FIG. 5, the shoulder of blocking ring 145 shields the gaps between the ground plate 128 and the cooling base 112, ensuring the facility plate 124 has no direct line of sight to the sidewalls of the plasma chamber 100C so that the potential for arcing therebetween is reduced. The blocking ring 145 may be coupled to the cooling base using a first fastener 155 and may be coupled to the ground plate 128 using a second fastener 157. Advantageously, this eliminates the bottom gap (FIG. 1) and allows for better control of the distance of the top gap 154 because the shoulder of the cooling base 112 sits on the blocking ring 145. Also, the seal force on the ESC 110 is decreased because only the force of the first seal 150 is transferred to the ESC 110. Furthermore, erosion of the insulator plate 126 is reduced because it is entirely moved to atmospheric pressure. In some embodiments, the blocking ring 145 may be coupled to the cooling base 112 and the insulator plate 126 via the first fastener 155.

Figure 6:
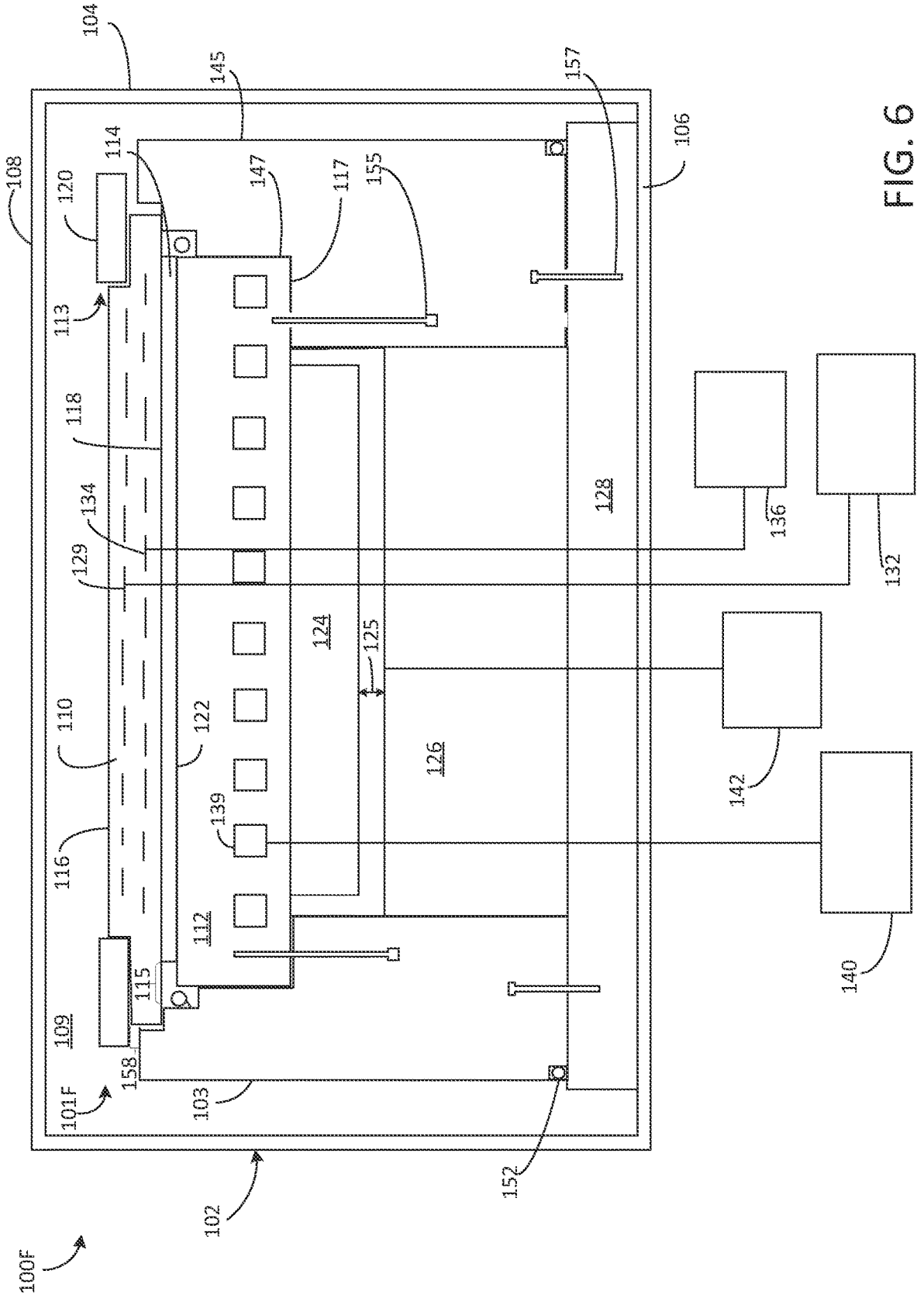
FIG. 6 is a cross-sectional schematic view of an exemplary plasma chamber including substrate support assembly according to an embodiment.

FIG. 6 is a cross-sectional schematic view of an exemplary plasma chamber 100F including substrate support assembly 101F according to an embodiment. Substrate support assembly 101F is similar to substrate support assembly 101E with the addition that the blocking ring 145 is disposed around a portion of the outer perimeter of the ESC 110 with gap 158 formed between the top of ledges 113 and the edge ring 120.

What is claimed is:

1. A substrate support assembly comprising:
an electrostatic chuck (ESC) assembly comprising:
a cooling base having a top surface and an outer diameter sidewall; and
an ESC having a substrate support surface, a bottom surface and an outer diameter sidewall, the bottom surface of the ESC coupled to the top surface of the cooling base by an adhesive layer;
a facility plate disposed under the cooling base;
an insulator plate disposed under the facility plate; and
a blocking ring disposed around the outer diameter sidewalls of the cooling base and ESC, the blocking ring shielding an interface between the bottom surface of the ESC and the top surface of the cooling base, wherein the blocking ring forms a vacuum seal with a bottom surface of the ESC and is level with a bottom surface of the cooling base, the blocking ring spaces the insulator plate and the facility plate, and the blocking ring isolates the cooling base from vacuum.

2. The substrate support assembly of claim 1, wherein the insulator plate surrounds the facility plate, and a portion of a top surface of the insulator plate horizontally extends beyond a top surface of the cooling base.

3. The substrate support assembly of claim 2, further comprising a grounding plate disposed under the insulation plate.

4. The substrate support assembly of claim 2, further comprising a top gap between the blocking ring and the bottom surface of the ESC and a bottom gap between the blocking ring and the top surface of the insulator plate.

5. The substrate support assembly of claim 2, wherein the blocking ring forms a seal with the ESC and the insulator plate via a bonding material.

6. The substrate support assembly of claim 2, wherein the blocking ring forms the vacuum seal with the ESC via a first seal and the blocking ring forms the vacuum seal with the insulator plate via a second seal.

7. The substrate support assembly of claim 6, wherein the ESC and the blocking ring are on opposite sides of the first seal.

8. The substrate support assembly of claim 1, wherein the cooling base comprises at least one cooling zone that are each coupled to a cooling supply.

9. The substrate support assembly of claim 1, wherein the blocking ring is made of a ceramic material.

10. A substrate support assembly comprising:
an electrostatic chuck (ESC) assembly comprising:
an ESC having a substrate support surface and a bottom surface; and
a cooling base disposed under the bottom surface of the ESC, wherein a portion of the bottom surface of the ESC horizontally extends beyond a top surface of the cooling base;
a facility plate disposed under the cooling base, wherein the bottom surface of the cooling base horizontally extends beyond the facility plate;
an insulator plate disposed under the facility plate, wherein a portion of a top surface of the insulator plate horizontally extends beyond the bottom surface of the cooling base; and
a blocking ring disposed directly under the bottom surface of the ESC that horizontally extends beyond a top surface of the cooling base and the top surface of the insulator plate that horizontally extends beyond the bottom surface of the cooling base, the blocking ring surrounding the cooling base, wherein the blocking ring forms a vacuum seal to the ESC via a first seal, the blocking ring forms a vacuum seal to the insulator plate via a second seal, and the blocking ring spaces the insulator plate and the facility plate.

11. The substrate support assembly of claim 10, wherein the blocking ring is coupled to the insulator plate and the cooling base via a fastener.

12. The substrate support assembly of claim 10, further comprising a top gap between the blocking ring and the bottom surface of the ESC that horizontally extends beyond a top surface of the cooling base.

13. The substrate support assembly of claim 10, wherein the blocking ring forms a seal with the bottom surface of the ESC that horizontally extends beyond a top surface of the cooling base with and the insulator plate via a blocking material.

14. The substrate support assembly of claim 10, further comprising a grounding plate disposed under the insulation plate.

15. A substrate support assembly comprising:
an electrostatic chuck (ESC) assembly comprising:
an ESC having a substrate support surface and a bottom surface; and
a cooling base disposed under the bottom surface of the ESC, wherein a portion of the bottom surface of the ESC horizontally extends beyond a top surface of the cooling base;
a facility plate disposed under the cooling base;
an insulator plate disposed under the facility plate, the bottom surface of the cooling base horizontally extending beyond the facility plate and the insulator plate;
a grounding plate disposed under the insulator plate, a portion of the grounding plate horizontally extending beyond the insulator plate; and
a blocking ring disposed directly under the bottom surface of the ESC that horizontally extends beyond a top surface of the cooling base and the portion of the grounding plate that horizontally extends beyond the insulator plate, wherein the blocking ring forms a vacuum seal to the ESC via a first seal, the blocking ring forms a vacuum seal to the grounding plate via a second seal, and the blocking ring spaces the insulator plate and the facility plate.

16. The substrate support assembly of claim 15, wherein the blocking ring is coupled to the cooling base via a first fastener and the blocking ring is coupled to the grounding plate using a second fastener.

17. The substrate support assembly of claim 15, further comprising a top gap between the blocking ring and the bottom surface of the ESC that horizontally extends beyond a top surface of the cooling base.

18. The substrate support assembly of claim 15, wherein the blocking ring forms a seal with the bottom surface of the ESC that horizontally extends beyond a top surface of the cooling base and with the grounding plate via a blocking material.

* * * * *